United States Patent
Wu et al.

(10) Patent No.: US 11,967,601 B2
(45) Date of Patent: Apr. 23, 2024

(54) BOTTOM-EMISSION LIGHT-EMITTING DIODE DISPLAY

(71) Applicant: Prilit Optronics, Inc., Tainan (TW)

(72) Inventors: Biing-Seng Wu, Tainan (TW);
Chao-Wen Wu, Tainan (TW);
Chun-Bin Wen, Tainan (TW);
Chien-Lin Lai, Tainan (TW);
Hsing-Ying Lee, Tainan (TW)

(73) Assignee: Prilit Optronics, Inc., Tainan (TW)

( * ) Notice: Subject to any disclaimer, the term of this patent is extended or adjusted under 35 U.S.C. 154(b) by 370 days.

(21) Appl. No.: 17/402,238

(22) Filed: Aug. 13, 2021

(65) Prior Publication Data
US 2023/0045824 A1 Feb. 16, 2023

(51) Int. Cl.
| | | |
|---|---|---|
| H01L 27/146 | (2006.01) |
| F21K 9/68 | (2016.01) |
| H01L 25/075 | (2006.01) |
| H01L 27/15 | (2006.01) |
| H01L 33/60 | (2010.01) |
| H01L 33/62 | (2010.01) |

(52) U.S. Cl.
CPC .......... *H01L 27/14629* (2013.01); *F21K 9/68* (2016.08); *H01L 25/0753* (2013.01); *H01L 27/153* (2013.01); *H01L 27/156* (2013.01); *H01L 33/60* (2013.01); *H01L 33/62* (2013.01)

(58) Field of Classification Search
None
See application file for complete search history.

(56) References Cited

U.S. PATENT DOCUMENTS

| | | | | |
|---|---|---|---|---|
| 2014/0369031 A1* | 12/2014 | Livesay | ................... | F21S 8/04 362/147 |
| 2017/0082896 A1* | 3/2017 | Jang | .................. | G02F 1/133603 |
| 2022/0165715 A1* | 5/2022 | Herrmann | ............... | H01L 33/52 |

FOREIGN PATENT DOCUMENTS

WO  WO2020229558 A1 * 11/2020

* cited by examiner

*Primary Examiner* — Feifei Yeung Lopez
(74) *Attorney, Agent, or Firm* — Donald E. Stout; Stout, Uxa & Buyan, LLP

(57) ABSTRACT

A bottom-emission light-emitting diode (LED) display includes a transparent substrate, a plurality of LEDs bonded on the substrate, a packaging layer formed on the substrate to cover the LEDs, and a reflecting layer formed on the packaging layer to reflect light emitted by the plurality of LEDs. The reflecting layer has a non-smooth shape or the packaging layer has different refractivities.

5 Claims, 4 Drawing Sheets

BOTTOM-EMISSION LIGHT-EMITTING DIODE DISPLAY

BACKGROUND OF THE INVENTION

1. Field of the Invention

The present invention generally relates to a bottom-emission light-emitting diode (LED) display, and more particularly to a bottom-emission LED display with high luminous efficiency.

2. Description of Related Art

A micro light-emitting diode (microLED, mLED or µLED) display panel is one of flat display panels, and is composed of microscopic microLEDs each having a size of 1-100 micrometers. Compared to conventional liquid crystal display panels, the microLED display panels offer better contrast, response time and energy efficiency. Although both organic light-emitting diodes (OLEDs) and microLEDs possess good energy efficiency, the microLEDs, based on group III/V (e.g., GaN) LED technology, offer higher brightness, higher luminous efficacy and longer lifespan than the OLEDs.

The bottom-emission (or bottom-emitting) LED display is one type of LED display, in which the LEDs emit lights downward instead of upward. In the bottom-emission LED display, lights emitted from the LEDs are firstly reflected and then proceed downward, which may probably be blocked by bonding pads of the LEDs and the corresponding contact areas (such as electrode traces) of the substrate, thereby reducing luminous efficiency. Moreover, the reflected lights may likely be absorbed by the LEDs, thereby further decreasing luminous efficiency.

A need has thus arisen to propose a novel bottom-emission LED display to overcome drawbacks of the conventional bottom-emission LED display.

SUMMARY OF THE INVENTION

In view of the foregoing, it is an object of the embodiment of the present invention to provide a bottom-emission LED display with a non-smooth reflecting/packaging layer or a packaging layer with different refractivities capable of improving luminous efficiency.

According to one embodiment, a bottom-emission light-emitting diode (LED) display includes a transparent substrate, a plurality of LEDs, a packaging layer and a reflecting layer. The LEDs are bonded on the substrate. The packaging layer is formed on the substrate to cover the LEDs. The reflecting layer is formed on the packaging layer to reflect light emitted by the LEDs. In one embodiment, the reflecting layer has a non-smooth shape. In another embodiment, the packaging layer has different refractivities.

DETAILED DESCRIPTION OF THE INVENTION

Figure 1:
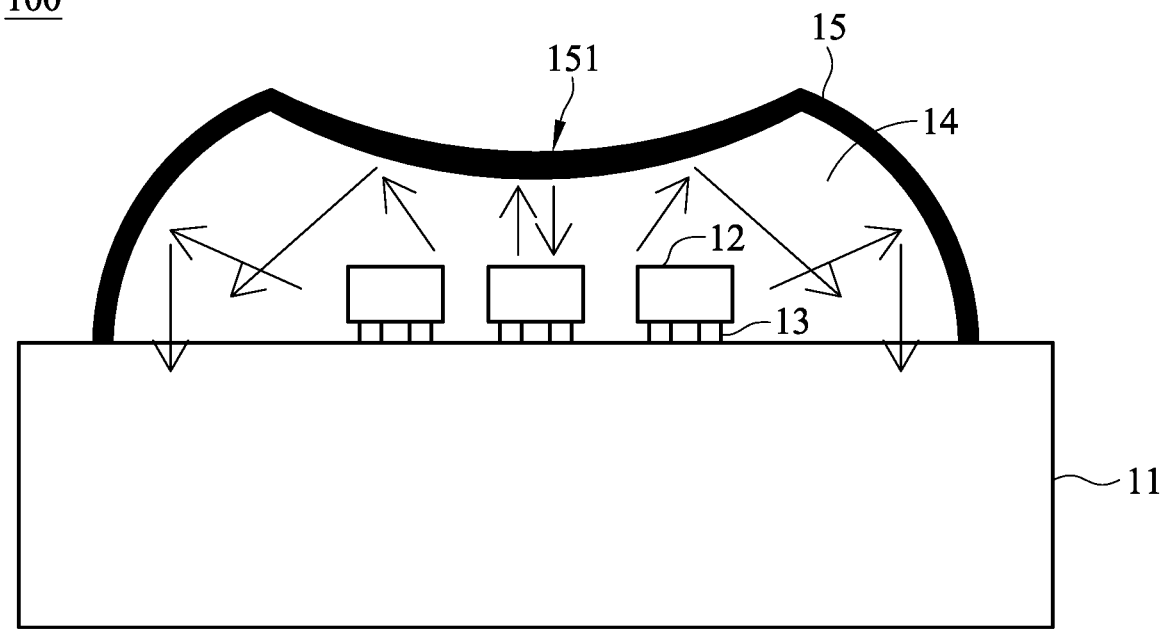
FIG. 1 shows a cross-sectional view illustrating a bottom-emission light-emitting diode (LED) display according to a first embodiment of the present invention.

FIG. 1 shows a cross-sectional view illustrating a bottom-emission light-emitting diode (LED) display 100 according to a first embodiment of the present invention.

In the embodiment, the bottom-emission LED display 100 may include a transparent substrate 11, such as glass, on which LEDs 12 are (flip) bonded via bonding pads (or solder bumps) 13. The bottom-emission LED display 100 of the embodiment may include a packaging layer 14 formed on the transparent substrate 11 to cover the LEDs 12.

In the embodiment, the bottom-emission LED display 100 may include a reflecting layer 15 formed on the packaging layer 14 to reflect light emitted by the LEDs 12. According to one aspect of the embodiment, the reflecting layer 15 and/or the packaging layer 14 has a non-smooth (outer) shape or surface. Specifically, in the embodiment, the reflecting layer 15 has a hollow 151 curving toward, and aligning with, the LEDs 12, which are red LED, green LED and blue LED in this embodiment.

According to the bottom-emission LED display 100 as illustrated in FIG. 1, lights are reflected from the reflecting layer 15 in more directions (as indicated by the arrows) than a conventional bottom-emission LED display with a smooth reflecting layer. Accordingly, it is more probable that the reflected lights may escape from bonding pads 13 of the LEDs 12 and corresponding contact areas (not shown) of the transparent substrate 11. Further, it is more likely that the reflected lights may escape from being absorbed by the LEDs 12. Therefore, luminous efficiency of the bottom-emission LED display 100 may be substantially improved.

In the embodiment, the packaging layer 14 may include a transparent material with high transmittance such as photoresist, epoxy resin, silicon-based glue, acrylic or polymer. The reflecting layer 15 may include a reflective material (e.g., with reflectivity higher than 70%) such as metal coating, reflective film or reflective glue.

In one embodiment, the non-smooth shape (of the packaging layer 14) of the bottom-emission LED display 100 may be formed by a semiconductor process. For example, a photomask (e.g., half-tone mask or slit mask) having areas with different light transmittances may be adopted to form the specific structure such as the hollow 151. Alternatively, the specific structure may be formed by subjecting an area to multiple cycles of photolithographic exposure to form the hollow 151.

In another embodiment, the non-smooth shape of the bottom-emission LED display 100 may be formed by a coating process. For example, the specific structure such as the hollow 151 may be formed by coating (e.g., inkjet printing, screen printing, spray or dispensing) with or without molding. Alternatively, the specific structure may be formed by compress molding and adjusting viscosity of the coating material.

In a further embodiment, the non-smooth shape of the bottom-emission LED display 100 may be formed by an adhesion process. For example, the specific structure such as the hollow 151 may be formed by applying a film with premade structures.

Figure 2:
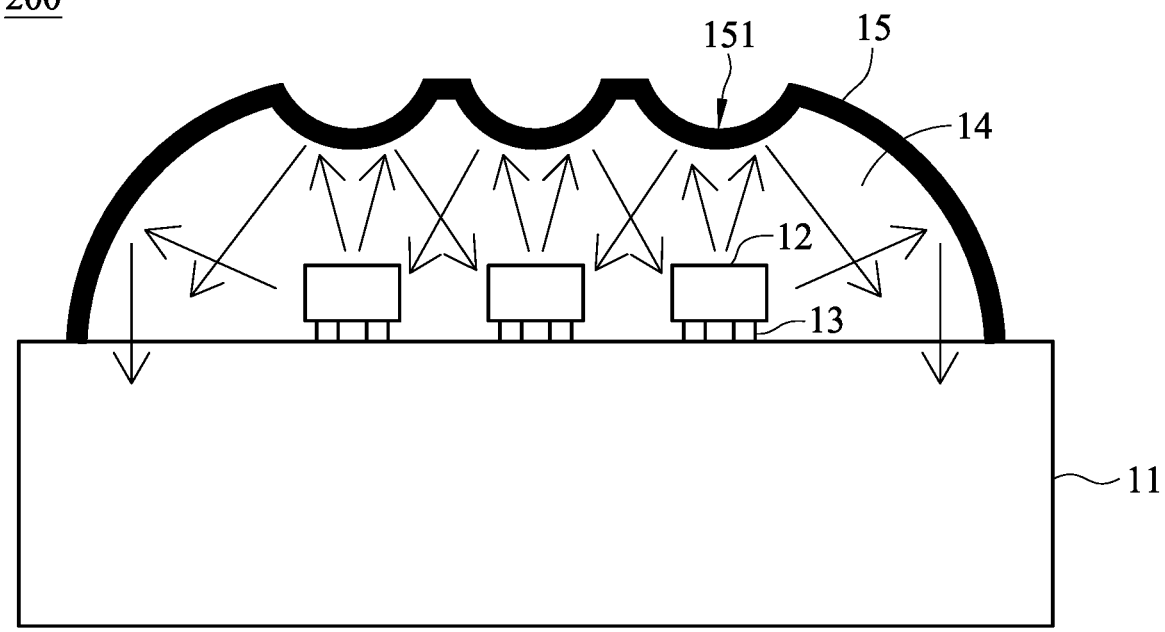
FIG. 2 shows a cross-sectional view illustrating a bottom-emission LED display according to a second embodiment of the present invention.

FIG. 2 shows a cross-sectional view illustrating a bottom-emission LED display 200 according to a second embodiment of the present invention. The bottom-emission LED display 200 is similar to the bottom-emission LED display 100 of FIG. 1 with the exceptions to be described below.

In the embodiment, the reflecting layer 15 and/or the packaging layer 14 has a non-smooth (outer) shape or surface. Specifically, in the embodiment, the reflecting layer 15 has a plurality of hollows 151 curving toward, and aligning with, the LEDs 12 (e.g., red LED, green LED and blue LED) respectively.

Figure 3:
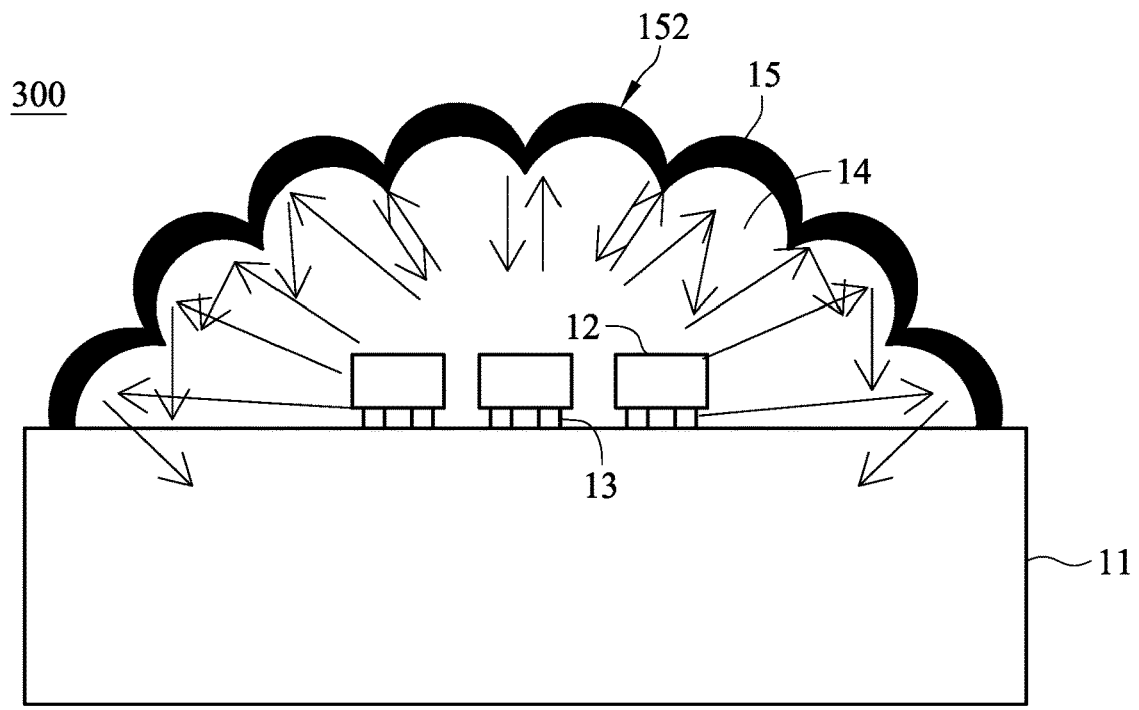
FIG. 3 shows a cross-sectional view illustrating a bottom-emission LED display according to a third embodiment of the present invention.

FIG. 3 shows a cross-sectional view illustrating a bottom-emission LED display 300 according to a third embodiment of the present invention. The bottom-emission LED display 300 is similar to the bottom-emission LED display 100 of FIG. 1 with the exceptions to be described below.

In the embodiment, the reflecting layer 15 has a non-smooth (outer) shape or surface. Specifically, in the embodiment, the reflecting layer 15 has a plurality of convex bumps 152 curving outward with respect to the LEDs 12.

Figure 4:
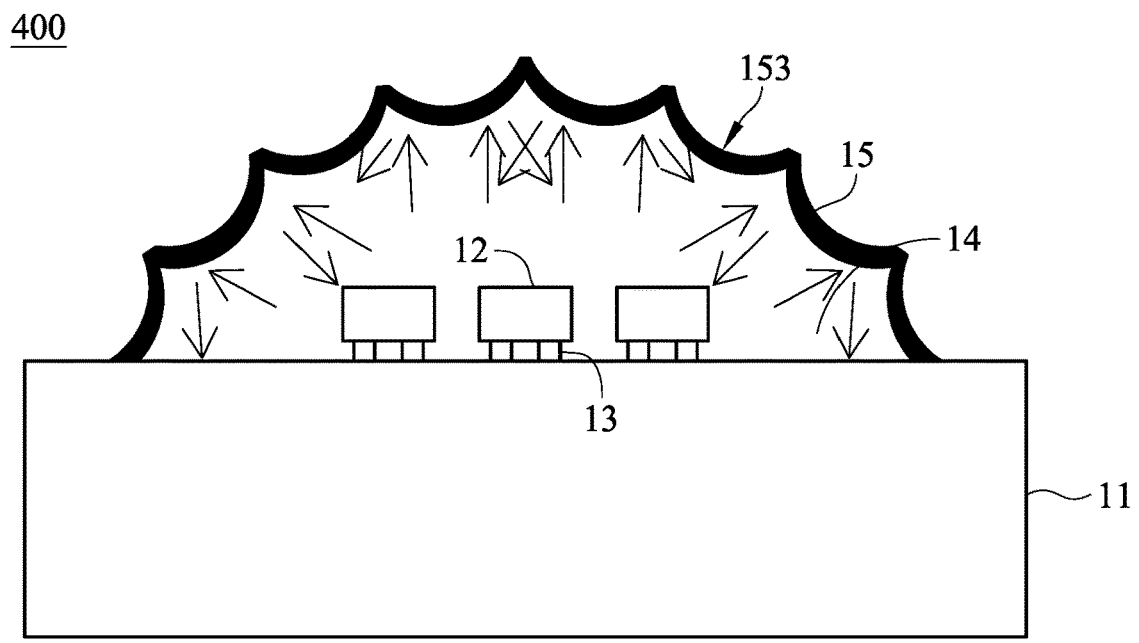
FIG. 4 shows a cross-sectional view illustrating a bottom-emission LED display according to a fourth embodiment of the present invention.

FIG. 4 shows a cross-sectional view illustrating a bottom-emission LED display 400 according to a fourth embodiment of the present invention. The bottom-emission LED display 400 is similar to the bottom-emission LED display 100 of FIG. 1 with the exceptions to be described below.

In the embodiment, the reflecting layer 15 has a non-smooth (outer) shape or surface. Specifically, in the embodiment, the reflecting layer 15 has a plurality of concave cavities 153 curving inward with respect to the LEDs 12.

Figure 5:
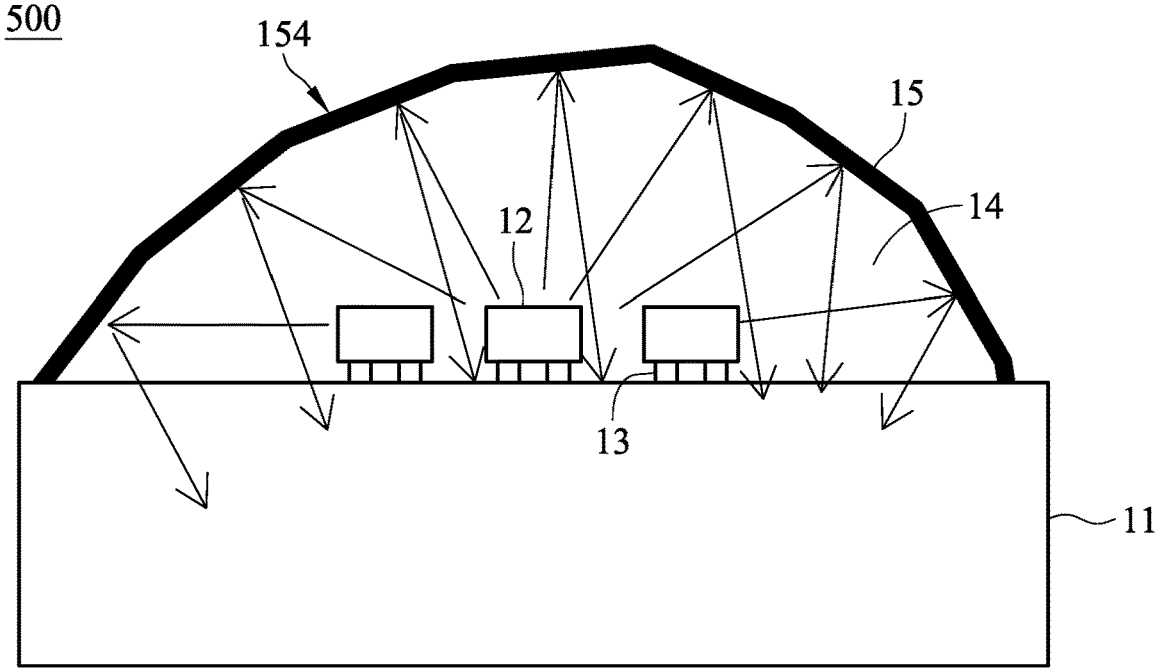
FIG. 5 shows a cross-sectional view illustrating a bottom-emission LED display according to a fifth embodiment of the present invention.

FIG. 5 shows a cross-sectional view illustrating a bottom-emission LED display 500 according to a fifth embodiment of the present invention. The bottom-emission LED display 500 is similar to the bottom-emission LED display 100 of FIG. 1 with the exceptions to be described below.

In the embodiment, the reflecting layer 15 has a non-smooth (outer) shape or surface. Specifically, in the embodiment, the reflecting layer 15 has a (convex) polyhedron shape with flat polygonal faces 154.

Figure 6:
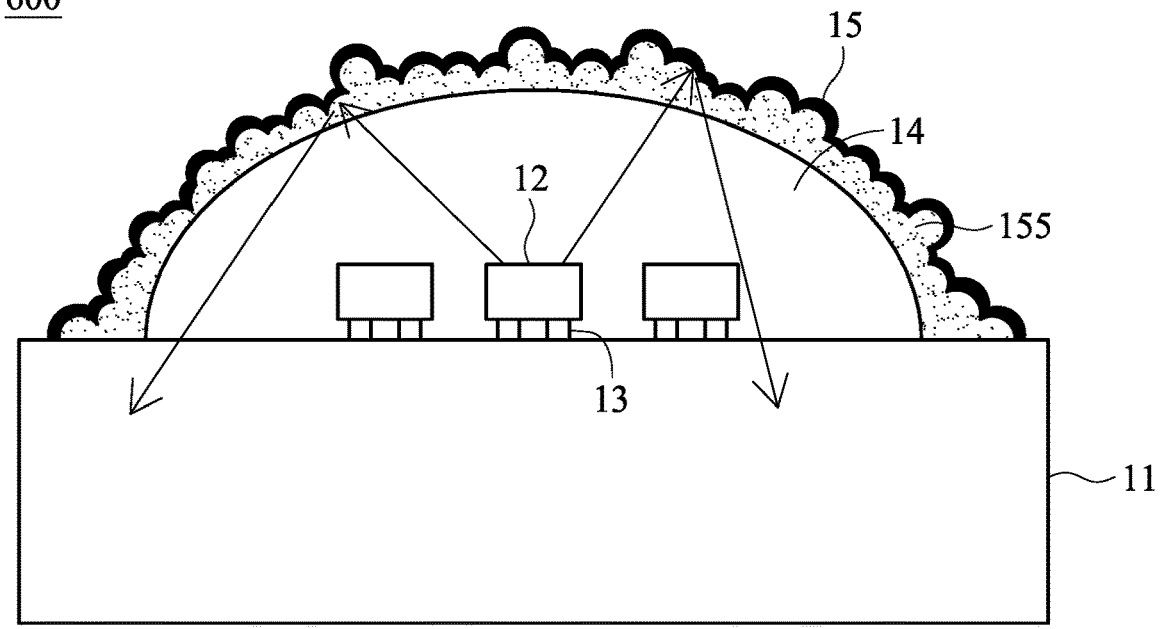
FIG. 6 shows a cross-sectional view illustrating a bottom-emission LED display according to a sixth embodiment of the present invention.

FIG. 6 shows a cross-sectional view illustrating a bottom-emission LED display 600 according to a sixth embodiment of the present invention. The bottom-emission LED display 600 is similar to the bottom-emission LED display 100 of FIG. 1 with the exceptions to be described below.

In the embodiment, the reflecting layer 15 has a non-smooth (outer) shape or surface. Specifically, in the embodiment, a surface of the reflecting layer 15 has an irregular shape. In one embodiment, the packaging layer 14 is covered with nanoparticles 155, followed by forming the reflecting layer 15 on the nanoparticles 155, thereby resulting in the irregular shape on the outer surface the reflecting layer 15.

Figure 7:
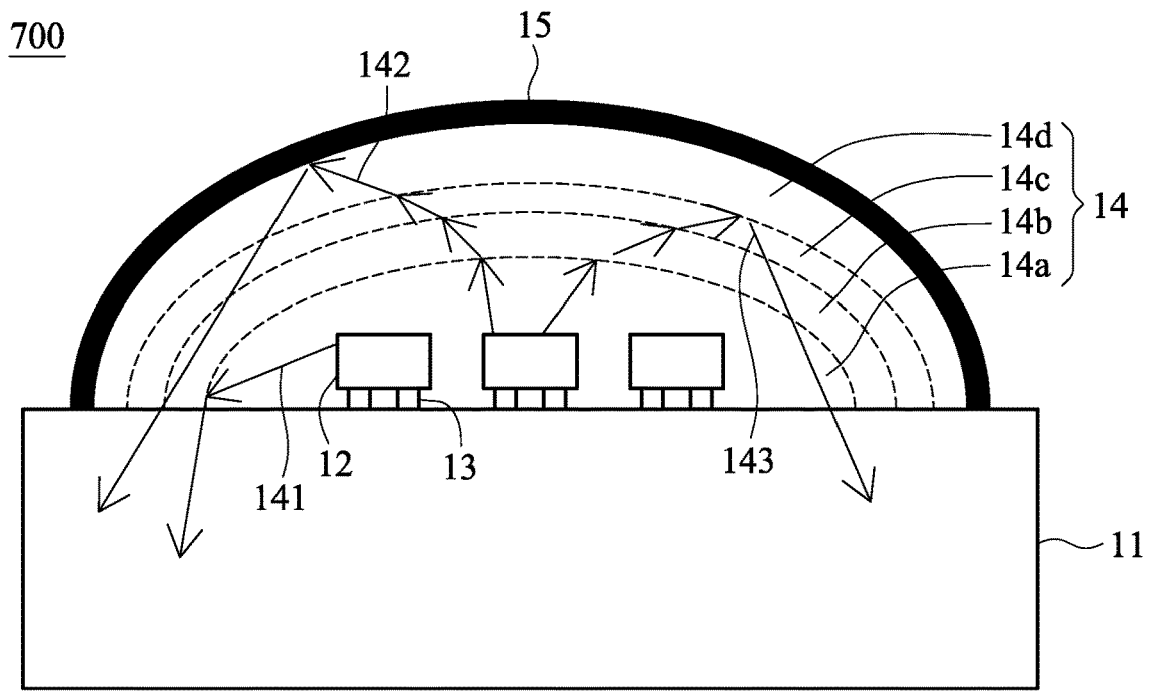
FIG. 7 shows a cross-sectional view illustrating a bottom-emission LED display according to a seventh embodiment of the present invention.

FIG. 7 shows a cross-sectional view illustrating a bottom-emission LED display 700 according to a seventh embodiment of the present invention.

In the embodiment, the bottom-emission LED display 700 may include a transparent substrate 11, such as glass, on which LEDs 12 are (flip) bonded via bonding pads (or solder bumps) 13. The bottom-emission LED display 700 of the embodiment may include a packaging layer 14 formed on the transparent substrate 11 to cover the LEDs 12, and a reflecting layer 15 formed on the packaging layer 14 to reflect light emitted by the LEDs 12.

According to one aspect of the embodiment, the packaging layer 14 may be composed of a plurality of packaging sub-layers (e.g., 14a-14d), which cover the LEDs 12 in sequence from the LEDs 12 toward the reflecting layer 15. In particular, in the embodiment, refractivity of a lower (or inner) packaging sub-layer is higher than refractivity of an upper (or outer) packaging sub-layer.

According to the bottom-emission LED display 700 as illustrated in FIG. 7, lights emitted from the LEDs 12 may likely be reflected back in directions other than the emitting directions. For example, as exemplified in FIG. 7, some lights emitted from the LEDs 12 are total reflected (as indicated by arrow 141) due to high refractivity of the packaging sub-layer 14a; some lights emitted from the LEDs 12 are refracted by the packaging sub-layers 14a-14d in series (as indicated by arrow 142) and are finally reflected by the reflecting layer 15; and some lights emitted from the LEDs 12 are refracted by the packaging sub-layers 14a-14c in series and are then total reflected (as indicated by arrow 143) due to low refractivity of the packaging sub-layer 14d.

Figure 8:
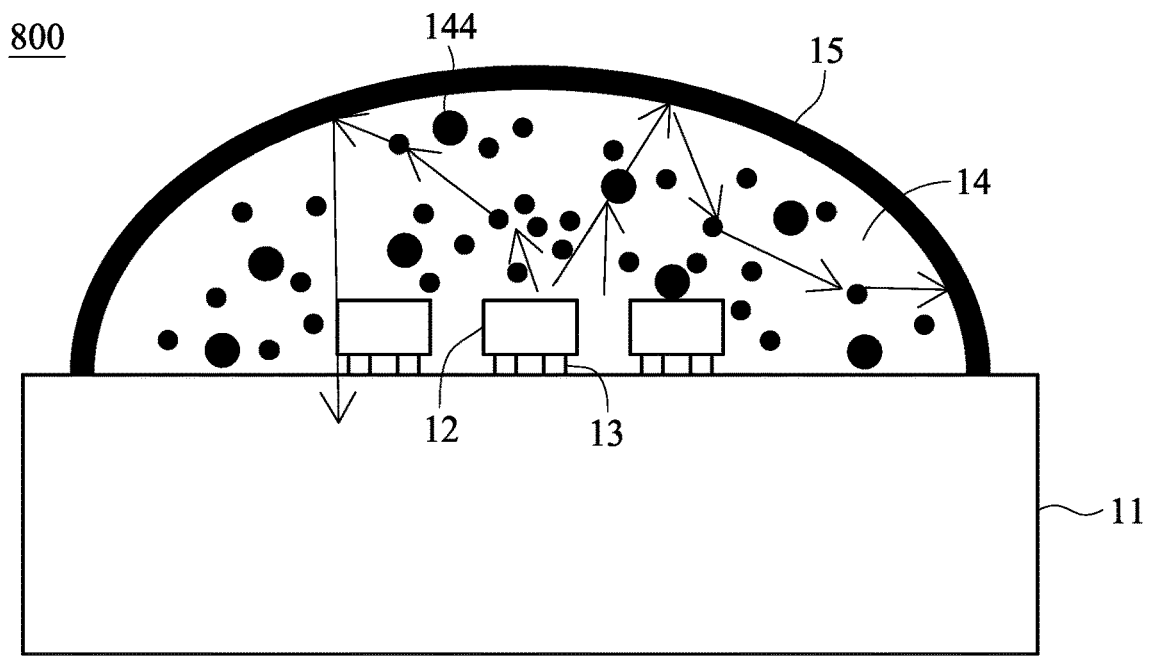
FIG. 8 shows a cross-sectional view illustrating a bottom-emission LED display according to an eighth embodiment of the present invention.

FIG. 8 shows a cross-sectional view illustrating a bottom-emission LED display 800 according to an eighth embodiment of the present invention.

In the embodiment, the bottom-emission LED display 800 may include a transparent substrate 11, such as glass, on which LEDs 12 are (flip) bonded via bonding pads (or solder bumps) 13. The bottom-emission LED display 800 of the embodiment may include a packaging layer 14 formed on the transparent substrate 11 to cover the LEDs 12, and a reflecting layer 15 formed on the packaging layer 14 to reflect light emitted by the LEDs 12.

According to one aspect of the embodiment, particles 144 or powders of different refractivities are added in the packaging layer 14 such that the lights emitted from the LEDs 12 are likely ejected (by the particles 144 or powders) in directions (as indicated by the arrows) other than the emitting directions. In the embodiment, the particles 144 or powders may be powder with high refractivity, quantum-dot (QD) powder or metal balls.

Although specific embodiments have been illustrated and described, it will be appreciated by those skilled in the art that various modifications may be made without departing from the scope of the present invention, which is intended to be limited solely by the appended claims.

What is claimed is:

1. A bottom-emission light-emitting diode (LED) display, comprising:
   a transparent substrate;
   a plurality of LEDs bonded on the substrate;
   a packaging layer formed on the substrate to cover the LEDs;
   a reflecting layer formed on the packaging layer to reflect light emitted by the plurality of LEDs; and
   nanoparticles disposed between the packaging layer and the reflecting layer, thereby resulting the reflecting layer with an irregular shape;
   wherein the reflecting layer has a non-smooth shape.

2. The display of claim 1, wherein the substrate comprises glass.

3. The display of claim 1, further comprising:
   bonding pads, via which the plurality of LEDs are bonded on the substrate.

4. The display of claim 1, wherein the packaging layer comprises a transparent material.

5. The display of claim 1, wherein the reflecting layer comprises a reflective material with reflectivity higher than 70%.

* * * * *